United States Patent [19]

Roh

[11] Patent Number: 5,644,164
[45] Date of Patent: Jul. 1, 1997

[54] SEMICONDUCTOR DEVICE WHICH DISSIPATES HEAT

[75] Inventor: Hyoung-ho Roh, Kyungki-do, Rep. of Korea

[73] Assignee: Samsung Aerospace Industries, Ltd., Kyongsangnam-do, Rep. of Korea

[21] Appl. No.: 648,832

[22] Filed: May 16, 1996

[30] Foreign Application Priority Data

Jul. 7, 1995 [KR] Rep. of Korea .................... 95-19924

[51] Int. Cl.⁶ .................................................. H01L 23/34
[52] U.S. Cl. ........................ 257/712; 257/675; 257/796
[58] Field of Search .............................. 257/712, 660, 257/666, 668, 776, 675, 796, 706, 720

[56] References Cited

U.S. PATENT DOCUMENTS

| | | | |
|---|---|---|---|
| 5,047,837 | 9/1991 | Kitano et al. | 257/666 |
| 5,073,817 | 12/1991 | Ueda | 257/712 |
| 5,093,713 | 3/1992 | Sawaya | 257/712 |
| 5,220,486 | 6/1993 | Takubo et al. | 257/712 |
| 5,365,107 | 11/1994 | Kuraishi et al. | 257/712 |
| 5,488,254 | 1/1996 | Nishimura | 257/712 |

FOREIGN PATENT DOCUMENTS

| | | | |
|---|---|---|---|
| 4128278 | 4/1979 | Japan | 257/712 |
| 61-99650 | 9/1986 | Japan | 257/712 |
| 2280364 | 11/1990 | Japan | 257/712 |
| 4267549 | 9/1992 | Japan | 257/660 |
| 4287355 | 10/1992 | Japan | 257/712 |
| 6120381 | 4/1994 | Japan | 257/712 |

*Primary Examiner*—Sara W. Crane
*Assistant Examiner*—Phat X. Cao
*Attorney, Agent, or Firm*—Finnegan, Henderson, Farabow, Garrett & Dunner, L.L.P.

[57] ABSTRACT

A semiconductor device includes a package accommodating a semiconductor chip, and a plurality of connecting leads. One end portion of each connecting lead being attached to the semiconductor chip by an adhesive member and the other end portion thereof being external to the package and connected to a circuit substrate. The semiconductor device further includes at least one heat-emitting lead whose one end portion is attached to the semiconductor chip by the adhesive member and whose other end portion is external to the package and is separated from the circuit substrate. The semiconductor device also includes a heat-emitting body inserted into the adhesive member and having one portion thereof connected to the heat-emitting lead.

7 Claims, 3 Drawing Sheets

5,644,164

SEMICONDUCTOR DEVICE WHICH DISSIPATES HEAT

BACKGROUND OF THE INVENTION

A. Field of the Invention

The present invention relates to a semiconductor device. More particularly, the present invention relates to a semiconductor device which dissipates heat generated from a semiconductor chip.

B. Description of the Related Art

Semiconductor devices are categorized into several types according to the packages in which the semiconductor chips are installed. A conventional lead-on-chip (LOC) type semiconductor device 9, in which leads are attached to a semiconductor chip with an adhesive (e.g., tape), is illustrated in FIG. 1. Referring to FIG. 1, the conventional semiconductor device 9 includes a package 1, a semiconductor chip 2, leads 3, and an adhesive member 4. One end portion of each lead 3 is attached by the adhesive member 4 to the semiconductor chip 2 installed in the package 1. The other end portion of each lead 3 is external to the package 1 and is connected to a circuit substrate 15.

A problem with the conventional semiconductor device 9 is that it does not effectively dissipate the heat generated from the semiconductor chip 2. Thus, the life span of the conventional semiconductor device 9 is reduced and the reliability of a product employing the device 9 is lowered.

SUMMARY OF THE INVENTION

Accordingly, the present invention is directed to a semiconductor device which effectively dissipates heat generated from a semiconductor chip and thus substantially obviates one or more of the problems due to the limitations and disadvantages of the related art.

Additional features and advantages of the invention will be set forth in part in the description which follows, and in part will be apparent from the description, or may be learned by practice of the invention. The objectives and other advantages of the invention will be realized and attained by the apparatus particularly pointed out in the written description and claims hereof as well as the appended drawings.

To achieve these and other advantages and in accordance with the present invention, as embodied and broadly described herein, the invention includes a semiconductor device having a package accommodating a semiconductor chip, and a plurality of connecting leads, one end portion of each connecting lead being attached to the semiconductor chip by an adhesive member and the other end portion thereof being external to the package and connected to a circuit substrate. The semiconductor device further has at least one heat conducting lead whose one end portion is attached to the semiconductor chip by the adhesive member and whose other end portion is external to the package and is separated from the circuit substrate. The semiconductor device also has a heat conducting body inserted into the adhesive member.

It is to be understood that both the foregoing general description and the following detailed description are exemplary and explanatory only and are intended to provide further explanation of the invention as claimed.

The accompanying drawings are included to provide a further understanding of the invention and are incorporated in and constitute a part of this specification, illustrate several embodiments of the invention, and together with the description, serve to explain the principles of the invention.

DESCRIPTION OF THE PREFERRED EMBODIMENT

Reference will now be made in detail to the present preferred embodiments of the invention, an example of which is illustrated in the accompanying drawings. Wherever possible, the same reference numbers will be used throughout the drawings to refer to the same or like parts.

Figure 1:
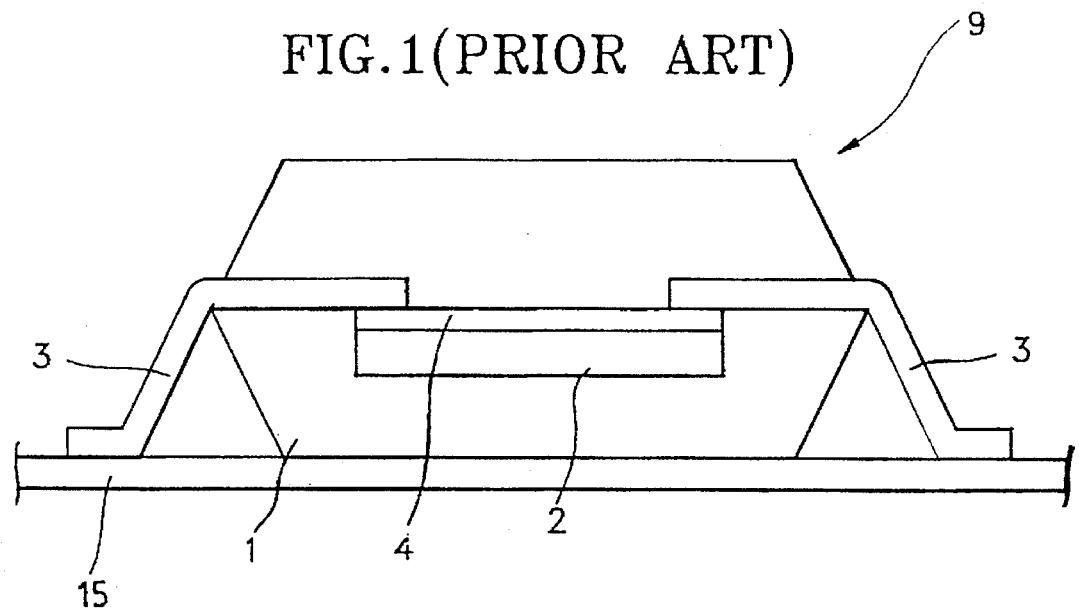
FIG. 1 is a sectional view of a conventional semiconductor device.
Figure 3:
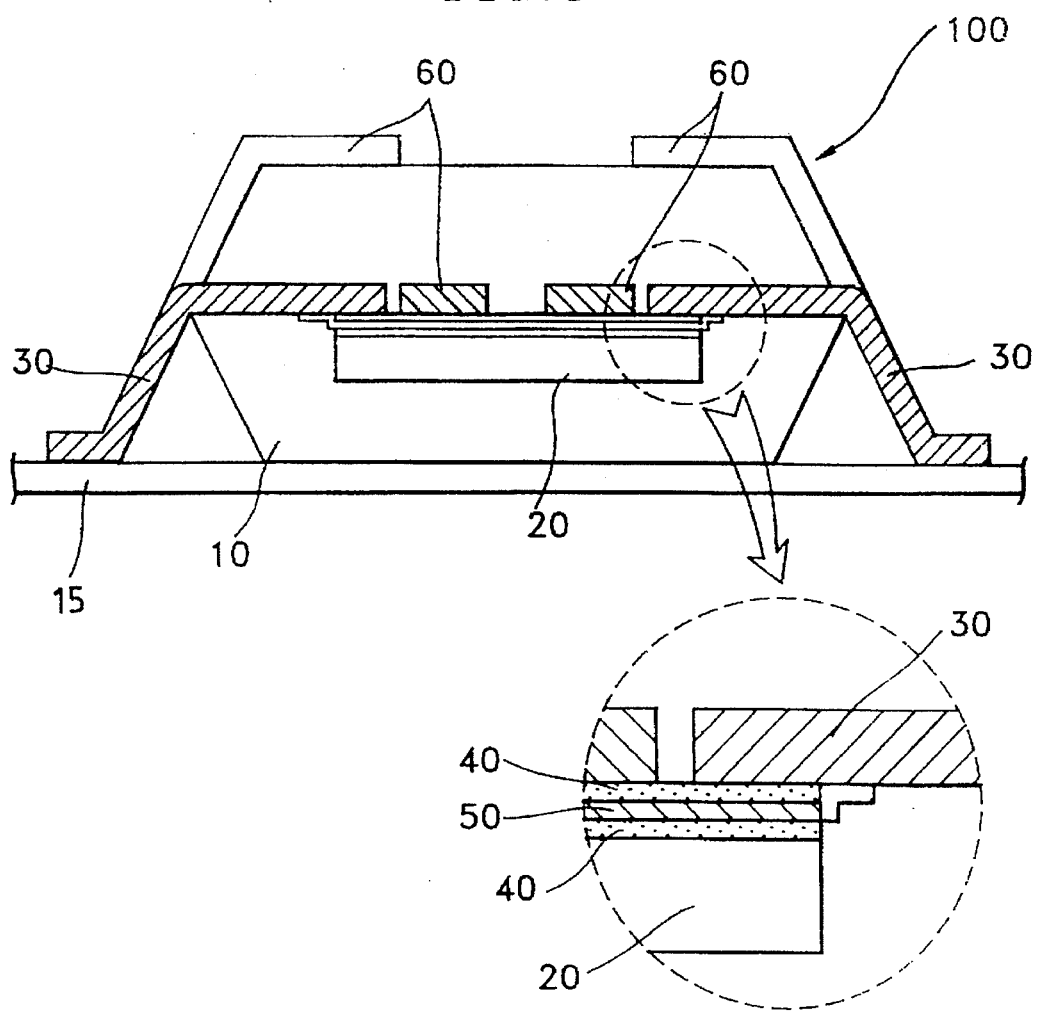
FIG. 3 is a sectional view of the semiconductor device shown in FIG. 2, taken along line III—III.
Figure 2:
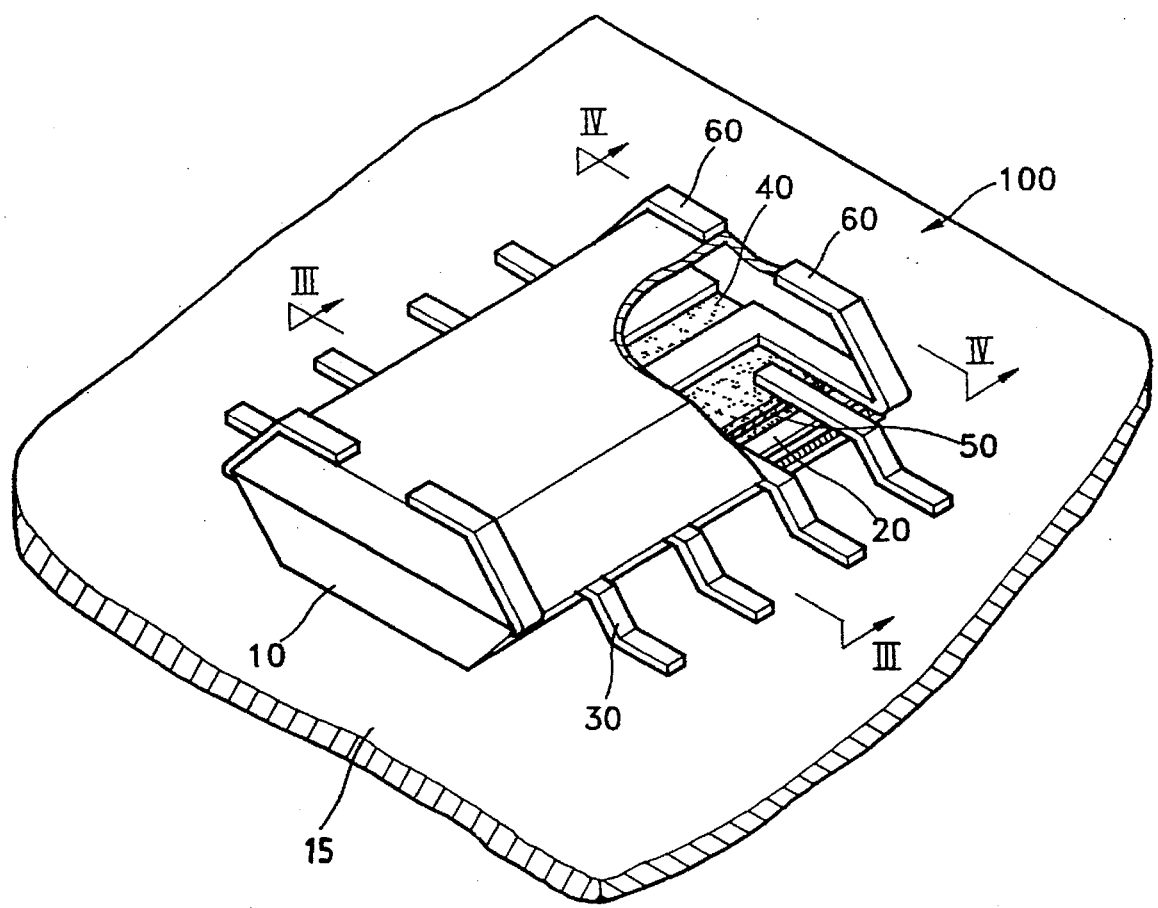
FIG. 2 is a perspective view of a semiconductor device according to the present invention.
Figure 4:
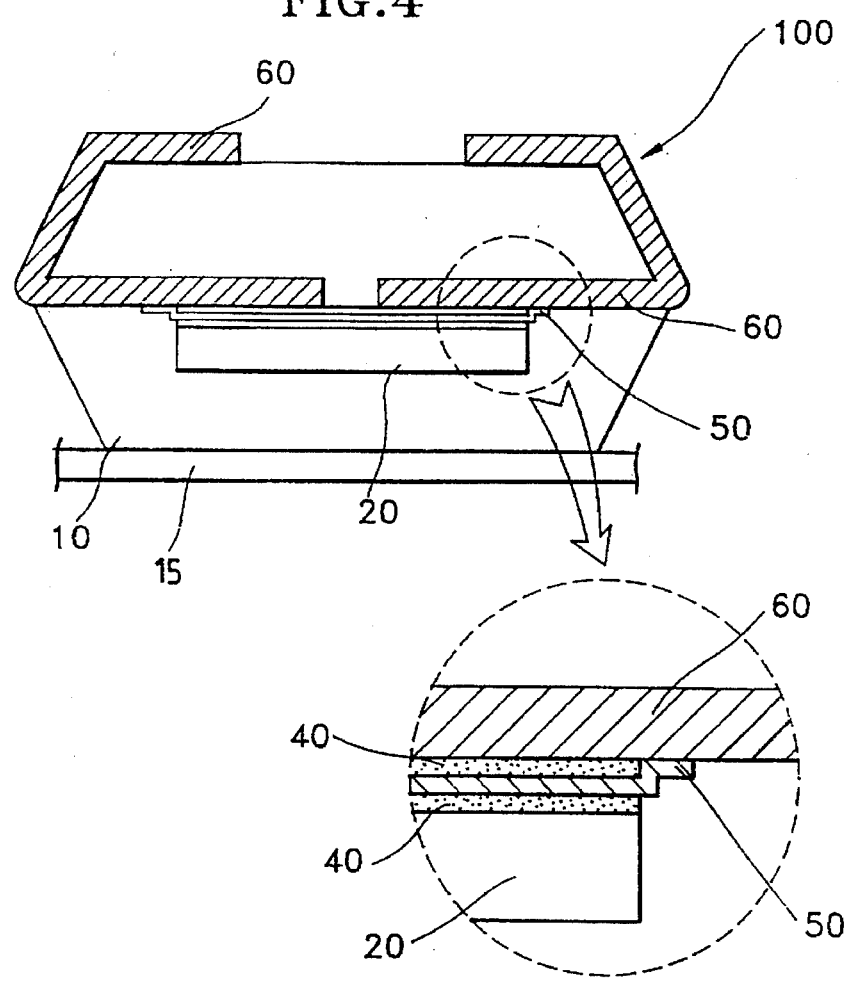
FIG. 4 is a sectional view of the semiconductor device shown in FIG. 2, taken along line IV—IV.

As embodied herein and referring to FIGS. 2–4, the exemplary embodiment of the semiconductor device 100 of the present invention includes a semiconductor chip 20 installed in a package 10. One end portion of each of a plurality of connecting leads 30 is attached to the semiconductor chip 20 by an adhesive member 40, such as tape. The other end portion of each connecting lead 30 is external to the package 10 and is connected to a circuit substrate 15.

The semiconductor device 100 further includes a plurality of heat conducting leads 60. One end portion, referred to as an internal end portion, of each heat conducting lead 60 is attached to the adhesive member 40 and the other end portion, referred to as an external end portion, of each heat conducting lead 60 is external to the package 10. The external end portions of the heat conducting leads 60 are preferably bent to closely contact the upper surface of the package 10 and are separated from the circuit substrate 15. Thus, the external end portions of the heat conducting leads 60 possess large surface areas without occupying a large space. Furthermore, the connection of the heat conducting leads 60 with the adhesive member 40 may be improved if the internal end portions of the heat conducting leads 60 are connected to one another.

A thin-plated heat conducting body 50 is inserted into the adhesive member 40. The heat-emitting body 50 is electrically isolated from the connecting leads 30. As shown in FIG. 4, it is preferable that the heat conducting body 50 has one portion connected to the heat conducting lead 60. The heat conducting body 50 and heat conducting leads 60 are preferably formed of an inexpensive and highly heat-conductive metal such as copper or aluminum.

In the semiconductor device 100 of the present invention, most of the heat generated from the semiconductor chip 20 is transferred through the heat conducting body 50 to the heat-emitting leads 60. Furthermore, since the external end portions of the heat conducting leads 60 are external to the package 10, the heat transferred to the heat conducting leads 60 is dissipated through the external end portions to the surrounding air. Therefore, the life span of the semiconductor device 100 can be increased, and the reliability of a product employing the semiconductor device 100 can be improved.

Figure 5:
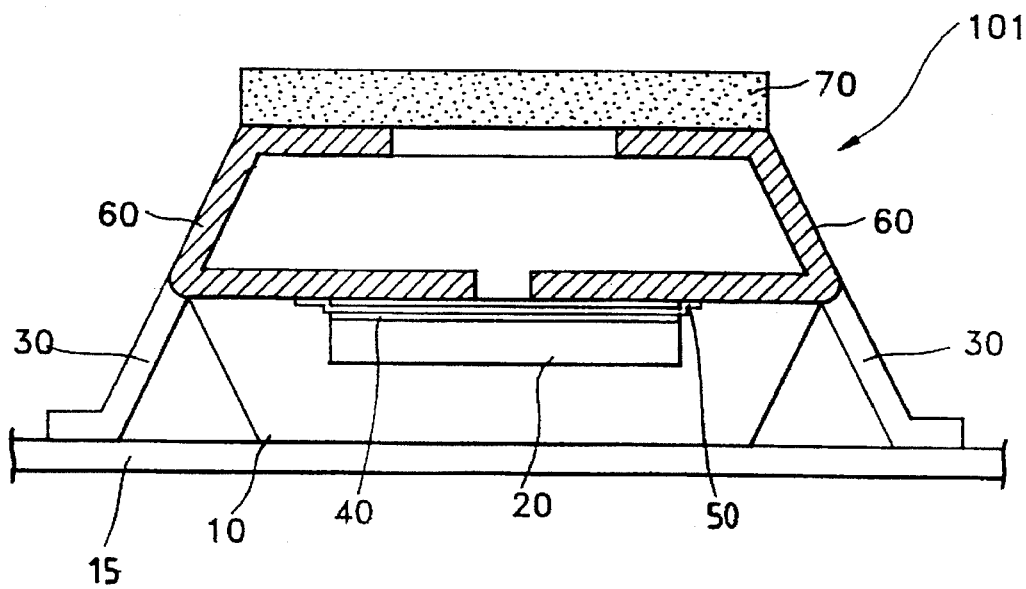
FIG. 5 is a sectional view of a semiconductor device according to another embodiment of the present invention.

The semiconductor device 100 of the exemplary embodiment is provided with a plurality of heat conducting leads 60, so as to obtain larger heat-emitting areas. However, the object of the present invention can alternatively be achieved by installing just one heat conducting lead 60 having an increased surface area the semiconductor device. The alternative embodiment of the semiconductor device 101 is shown in FIG. 5.

The semiconductor device 101 is comprised of a package 10 accommodating a semiconductor chip 20, and a plurality of connecting leads 30. One end portion of each connecting lead 30 is attached to the semiconductor chip 20 by an adhesive member 40, while the other end portion is external to the package 10 and is connected to a circuit substrate 15. The semiconductor device 101 further includes a plurality of heat conducting leads 60. One end portion of each heat conducting lead 60 is attached to the semiconductor chip 20 by the adhesive member 40 and the other end portion, referred to as an external end portion, is external to the package 10 and is separated from the circuit substrate 15. A heat conducting body 50 is inserted into the adhesive member 40 and includes a portion which is connected to the heat conducting leads 60.

The semiconductor device 101 further includes a heat-dispersion member 70 which is connected to the external end portions of the heat conducting leads 60. The heat-dispersion member 70 is preferably formed of copper or aluminum. The heat-exchange area of semiconductor device 101 is increased in accordance with the surface area of the heat-dispersion member 70. Thus, semiconductor device 101 can even more effectively dissipate the heat generated from the semiconductor chip 20.

It will be apparent to those skilled in the art that various modifications and variations can be made in the semiconductor device of the present invention without departing from the spirit or scope of the invention. Thus, it is intended that the present invention cover the modifications and variations of this invention provided they come within the scope of the appended claims and their equivalents.

What is claimed is:

1. A semiconductor device, comprising:

a package;

a semiconductor chip contained within the package;

an adhesive member attached to the semiconductor chip;

a plurality of connecting leads, one end portion of each connecting lead being attached to said semiconductor chip by said adhesive member which is located between said connecting lead end portions and said semiconducting chip, and the end portion thereof being external to said package and adapted for connection to a circuit substrate;

at least one heat-conducting lead having one end portion being attached to said semiconductor chip by said adhesive member which is located between said at least one heat-conducting lead end portion and said semiconductor chip, and another end portion being external to said package and separated from said circuit substrate; and a heat-conducting body at least partially embedded in said adhesive member.

2. The semiconductor device of claim 1, wherein said heat-conducting body and heat-conducting lead comprise copper or aluminum.

3. The semiconductor device of claim 1, wherein said at least one heat-conducting lead includes a plurality of heat-conducting leads and the end portions of said plurality of heat-conducting leads are connected to one another and are attached to said semiconductor chip by said adhesive member.

4. The semiconductor device of claim 1, wherein the external end portion of said heat-conducting lead is bent to contact said package.

5. The semiconductor device of claim 1, further comprising a heat-dispersion member connected to the external end portion of said heat-conducting lead.

6. The semiconductor device of claim 5, wherein said heat-dispersion member includes copper or aluminum.

7. The semiconductor device of claim 1, wherein said heat-conducting body has one portion connected to said heat-conducting lead.

* * * * *

UNITED STATES PATENT AND TRADEMARK OFFICE
CERTIFICATE OF CORRECTION

PATENT NO. : 5,644,164
DATED : July 01, 1997
INVENTOR(S) : Hyoung-ho ROH

It is certified that error appears in the above-indentified patent and that said Letters Patent is hereby corrected as shown below:

In Claim 1, col. 4, line 6, before "end portion", insert --other--.

Signed and Sealed this

Ninth Day of December, 1997

Attest:

BRUCE LEHMAN

Attesting Officer      Commissioner of Patents and Trademarks